(12) United States Patent
Kajitani et al.

(10) Patent No.: US 10,355,143 B2
(45) Date of Patent: Jul. 16, 2019

(54) NITRIDE SEMICONDUCTOR DEVICE

(71) Applicant: PANASONIC CORPORATION, Osaka (JP)

(72) Inventors: Ryo Kajitani, Osaka (JP); Daisuke Shibata, Kyoto (JP); Kenichiro Tanaka, Osaka (JP); Satoshi Tamura, Osaka (JP); Masahiro Ishida, Osaka (JP); Tetsuzo Ueda, Osaka (JP)

(73) Assignee: PANASONIC CORPORATION, Osaka (JP)

(*) Notice: Subject to any disclaimer, the term of this patent is extended or adjusted under 35 U.S.C. 154(b) by 0 days.

(21) Appl. No.: 15/816,510

(22) Filed: Nov. 17, 2017

(65) Prior Publication Data

US 2018/0097123 A1   Apr. 5, 2018

Related U.S. Application Data

(63) Continuation of application No. PCT/JP2016/001276, filed on Mar. 9, 2016.

(30) Foreign Application Priority Data

May 21, 2015   (JP) .................. 2015-103772

(51) Int. Cl.
*H01L 29/00* (2006.01)
*H01L 29/862* (2006.01)
(Continued)

(52) U.S. Cl.
CPC ............ *H01L 29/862* (2013.01); *H01L 27/15* (2013.01); *H01L 29/0619* (2013.01);
(Continued)

(58) Field of Classification Search
CPC .......... H01L 21/0254; H01L 21/30612; H01L 21/0262; H01L 29/47; H01L 29/06;
(Continued)

(56) References Cited

U.S. PATENT DOCUMENTS 6,693,308 B2 * 2/2004 Sankin ............... H01L 29/0619
                                                          257/102
8,637,872 B2 * 1/2014 Sugai ................. H01L 21/0495
                                                          257/77

(Continued)

FOREIGN PATENT DOCUMENTS

JP    2000-252478 A    9/2000
JP    2008-177369 A    7/2008
(Continued)

OTHER PUBLICATIONS

International Search Report issued in Application No. PCT/JP2016/001276 dated Jun. 14, 2016, with English translation.

*Primary Examiner* — Nikolay K Yushin
(74) *Attorney, Agent, or Firm* — McDermott Will & Emery LLP

(57) ABSTRACT

A nitride semiconductor device includes: a substrate having a first major surface and a second major surface; a first nitride semiconductor layer of an n-type which is disposed on the first major surface and has a protrusion; a second nitride semiconductor layer of a p-type disposed on the protrusion; a first anode electrode disposed above the first nitride semiconductor layer and the second nitride semiconductor layer; and a cathode electrode disposed under the second major surface, and a lateral surface of the protrusion is inclined by a first angle with respect to the first major surface.

11 Claims, 12 Drawing Sheets

(51) Int. Cl.
| | |
|---|---|
| *H01L 29/872* | (2006.01) |
| *H01L 29/06* | (2006.01) |
| *H01L 29/12* | (2006.01) |
| *H01L 29/20* | (2006.01) |
| *H01L 29/205* | (2006.01) |
| *H01L 29/417* | (2006.01) |
| *H01L 29/66* | (2006.01) |
| *H01L 29/40* | (2006.01) |
| *H01L 27/15* | (2006.01) |
| *H01L 33/20* | (2010.01) |
| *H01L 21/00* | (2006.01) |
| *H01L 21/02* | (2006.01) |
| *H01L 21/306* | (2006.01) |
| *H01L 29/47* | (2006.01) |
| *H01L 33/38* | (2010.01) |

(52) U.S. Cl.
CPC ...... *H01L 29/0661* (2013.01); *H01L 29/0692* (2013.01); *H01L 29/122* (2013.01); *H01L 29/2003* (2013.01); *H01L 29/205* (2013.01); *H01L 29/402* (2013.01); *H01L 29/417* (2013.01); *H01L 29/66212* (2013.01); *H01L 29/872* (2013.01); *H01L 33/20* (2013.01); *H01L 21/0254* (2013.01); *H01L 21/0262* (2013.01); *H01L 21/30612* (2013.01); *H01L 29/475* (2013.01); *H01L 33/38* (2013.01)

(58) Field of Classification Search
CPC ............. H01L 29/66212; H01L 29/417; H01L 29/122; H01L 29/2003; H01L 29/862; H01L 29/0692; H01L 29/0661; H01L 29/205; H01L 33/20; H01L 33/38; H01L 33/486; H01L 33/32; H01L 33/0077
See application file for complete search history.

(56) References Cited

U.S. PATENT DOCUMENTS

| | | | |
|---|---|---|---|
| 8,896,084 B2 * | 11/2014 | Sugawara | ........... H01L 29/0615 257/471 |
| 9,660,141 B2 * | 5/2017 | Koike | ................... H01L 33/007 |
| 2012/0313212 A1 | 12/2012 | Sugawara | |
| 2014/0273417 A1 | 9/2014 | Zhu et al. | |
| 2016/0149079 A1 * | 5/2016 | Koike | ................... H01L 33/007 257/79 |

FOREIGN PATENT DOCUMENTS

| | | |
|---|---|---|
| JP | 2012-094889 A | 5/2012 |
| JP | 5607720 B2 | 10/2014 |
| JP | 2015-076435 A | 4/2015 |

* cited by examiner

END PORTION OF FIRST ANODE ELECTRODE 108

END PORTION OF FIRST ANODE ELECTRODE 108

END PORTION OF FIRST ANODE ELECTRODE 108

END PORTION OF FIRST ANODE ELECTRODE 108

END PORTION OF FIRST ANODE ELECTRODE 108

END PORTION OF FIRST ANODE ELECTRODE 108

NITRIDE SEMICONDUCTOR DEVICE

CROSS REFERENCE TO RELATED APPLICATIONS

This application is a U.S. continuation application of PCT International Patent Application Number PCT/JP2016/001276 filed on Mar. 9, 2016, claiming the benefit of priority of Japanese Patent Application Number 2015-103772 filed on May 21, 2015, the entire contents of which are hereby incorporated by reference.

BACKGROUND

1. Technical Field

The present disclosure relates to a nitride semiconductor device.

2. Description of the Related Art

U.S. Patent Application Publication No. 2014/273417 discloses a Schottky barrier diode (SBD) including an n-type GaN layer on which a guard ring including p-type GaN is formed. Particularly, U.S. Patent Application Publication No. 2014/273417 discloses that the structure in FIG. 11 has the effect of forming depletion regions along the top surface of the n-GaN layer to reduce the concentration of charge of the top surface, which results in enhanced breakdown performance of the Schottky barrier diode.

SUMMARY

However, the structure according to U.S. Patent Application Publication No. 2014/273417 has a problem that, although the forward voltage can be reduced and the reverse breakdown voltage can be increased, the peak forward surge current cannot be increased enough.

In view of the above-described problem, the present disclosure has an object of providing a nitride semiconductor device achieving a high reverse breakdown voltage, a low forward voltage, and a high peak forward surge current.

In order to solve the above-described problem, a nitride semiconductor device according to one aspect of the present disclosure includes: a substrate having a first major surface and a second major surface; a first nitride semiconductor layer of a first conductivity type which is disposed on the first major surface and has a protrusion; a second nitride semiconductor layer of a second conductivity type disposed on the protrusion; a first anode electrode disposed above the first nitride semiconductor layer and the second nitride semiconductor layer; and a cathode electrode disposed under the second major surface, and a lateral surface of the protrusion is inclined by a first angle with respect to the first major surface.

With the present disclosure, it is possible to provide a nitride semiconductor device achieving a high reverse breakdown voltage, a low forward voltage, and a high peak forward surge current.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Underlying Knowledge Forming Basis of the Invention

The inventors of the present disclosure found that the conventional diode described in "Description of the Related Art" above has the following problem.

In the structure according to U.S. Patent Application Publication No. 2014/273417, when a forward voltage is applied and holes are injected from the p-type GaN layer, electron-hole pairs recombine and thus light is emitted at the pn junction region between the p-type GaN layer and the n-type GaN layer. By the light being reabsorbed in the n-type GaN layer, electron-hole pairs are formed. Here, the on-resistance is reduced due to the so-called photoconductive effect: by the increase in hole density of the n-type GaN layer, the n-type GaN layer is positively charged and the effective electron density is increased. This increases the forward current at a time of high voltage application, which improves the peak forward surge current. A diode having a high peak forward surge current is less likely to be broken by a rapid inflowing of a surge current.

Here, the guard ring is generally formed by selectively etching the p-type GaN layer. At this time, when the p-type GaN layer remains in a region other than the guard ring, the Schottky contact region is reduced and the pn junction region is increased, which increases the forward voltage. However, in manufacturing, it is difficult to completely remove the p-type GaN layer only. In view of the above, as a way to completely remove the p-type GaN layer from the region other than the guard ring, overetching the p-type GaN layer to remove also a part of the surface of the n-type GaN layer is one option.

Figure 1:
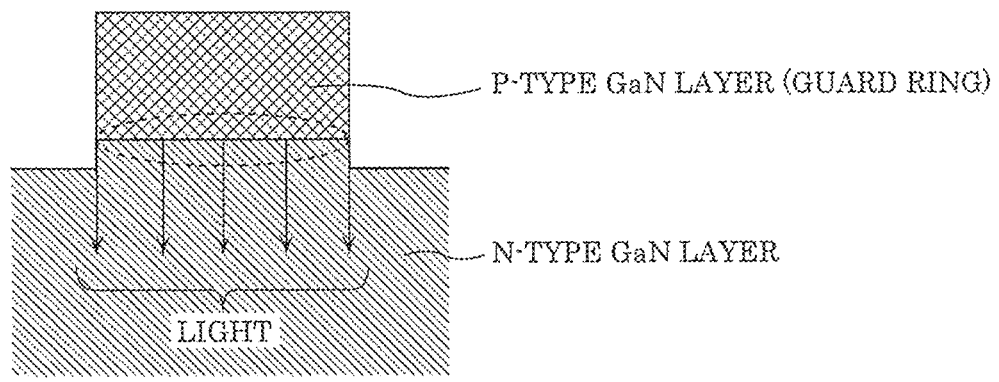
FIG. 1 is a schematic cross-sectional view of a pn junction including a guard ring formed by overetching a p-type GaN layer.

FIG. 1 is a schematic cross-sectional view of a pn junction having a guard ring formed by overetching the p-type GaN layer. The guard ring formed by the above-described manufacturing method is, as illustrated in FIG. 1, disposed on the protrusion formed on the surface of the n-type GaN layer. In this case, the light emitted at the pn junction region can be diffused only immediately under the guard ring, because a lateral surface of the protrusion becomes an obstacle. Therefore, the light hardly reaches the outside of the guard ring in a plan view, which makes the effect of reduction in the on-resistance brought by the photoconductive effect insufficient. In other words, the guard ring having the shape illustrated in FIG. 1 has a problem that the peak forward surge current cannot be sufficiently increased.

In order to solve the above-described problem, a nitride semiconductor device according to one aspect of the present disclosure includes: a substrate having a first major surface and a second major surface; a first nitride semiconductor layer of a first conductivity type which is disposed on the first major surface and has a protrusion; a second nitride semiconductor layer of a second conductivity type disposed on the protrusion; a first anode electrode disposed above the first nitride semiconductor layer and the second nitride semiconductor layer; and a cathode electrode disposed under the second major surface, and a lateral surface of the protrusion is inclined by a first angle with respect to the first major surface.

With this aspect, it is possible to provide a nitride semiconductor device achieving a high reverse breakdown voltage, a low forward voltage, and a high peak forward surge current.

The following describes embodiments of a nitride semiconductor device according to the present disclosure with reference to the Drawings. Constituent elements representing substantially the same structures may be assigned with the same reference numbers and the explanation may be omitted in some cases. Note that each of the embodiments described below is a specific example of the present disclosure. The numerical values, shapes, materials, constituent elements, the arrangement and connection of the constituent elements, etc. shown in the following embodiments are mere examples, and thus do not determine the present disclosure. Various modifications to the embodiments that can be conceived by those skilled in the art which are within the essence of the present disclosure may be included in the scope of the present disclosure. At least a part of the embodiments and variations may be combined within the essence of the present disclosure.

Embodiment 1

Figure 2:
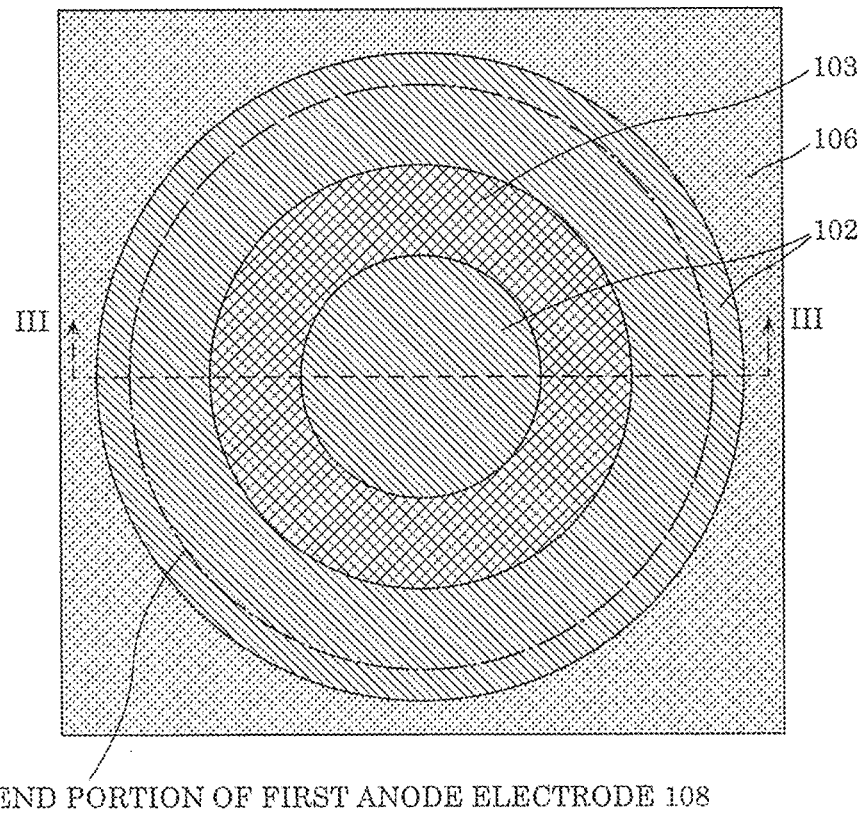
FIG. 2 is a plan view of a nitride semiconductor device according to Embodiment 1.
Figure 3:
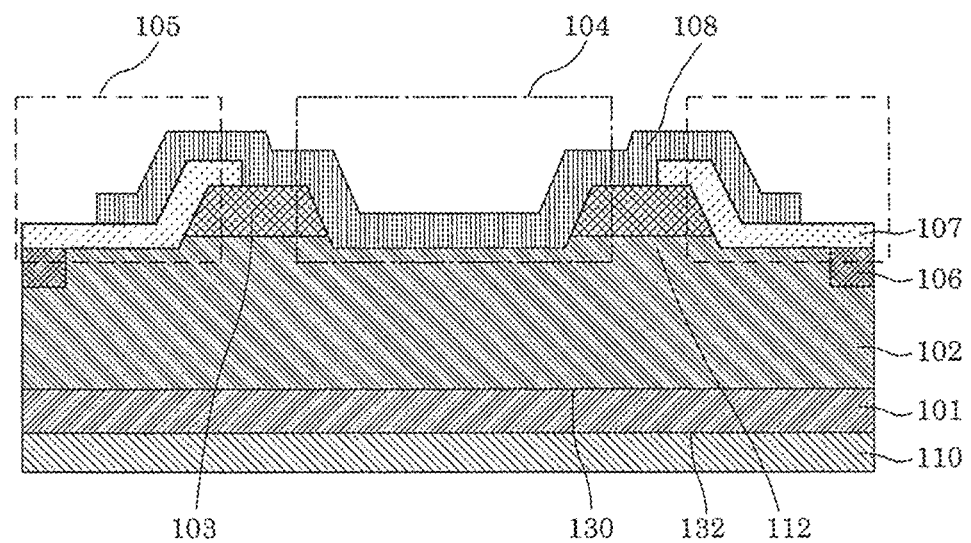
FIG. 3 is a cross-sectional view of the nitride semiconductor device according to Embodiment 1.

FIG. 2 is a plan view of a nitride semiconductor device according to Embodiment 1. FIG. 2 is a plan view excluding insulating film 107 and first anode electrode 108 which will be described later. FIG. 3 is a cross-sectional view of the nitride semiconductor device according to Embodiment 1. FIG. 3 is a cross-sectional view, at an III-III line, of the semiconductor device in FIG. 2. As illustrated in FIG. 3, the nitride semiconductor device according to Embodiment 1 includes substrate 101, first nitride semiconductor layer 102, second nitride semiconductor layer 103, recess 104, mesa 105, injection separation portion 106, insulating film 107, first anode electrode 108, and cathode electrode 110.

Substrate 101 is, for example, a GaN substrate of an n-type (first conductivity type) including an n-type impurity. Substrate 101 has first major surface 130 and second major surface 132, and has a film thickness in a range of from 300 µm to 600 µm. Note that silicon (Si) and germanium (Ge) can be used as the n-type impurity, and magnesium (Mg) can be used as the p-type impurity. Hereinafter, unless otherwise noted, n-type- and p-type-indicates inclusion of the respective one of the above-described impurities. Substrate 101 may be a substrate other than a GaN substrate, and may be any substrate that is conductive and lattice-matches with a semiconductor layer on substrate 101 within an acceptable range from the perspective of properties of the device. For example, an n-type gallium oxide ($Ga_2O_3$) substrate and an n-type silicon carbide (SiC) substrate may be adopted. Although an n-type Si substrate may be used, in this case, a buffer layer may be provided to lattice-match the n-type Si substrate with the upper layers.

First nitride semiconductor layer 102 is, for example, an n-type GaN layer disposed on an upper surface (first major surface) of substrate 101. First nitride semiconductor layer 102 has a film thickness in a range of from 10 µm to 20 µm, for example. The n-type impurity has a concentration in a range of from approximately $1\times10^{15}$ cm$^{-3}$ to $1\times10^{17}$ cm$^{-3}$, for example. First nitride semiconductor layer 102 is formed by the metal organic chemical vapor deposition (MOCVD), for example.

First nitride semiconductor layer 102 has protrusion 112 formed by overetching which will be described below. In the present Specification, the "protrusion" may have, in a cross-sectional view, a corner angle which is one of a right angle, an obtuse angle, and rounded.

Second nitride semiconductor layer 103 is, for example, a p-type (second conductivity-type) GaN layer disposed on first nitride semiconductor layer 102, and more specifically, on protrusion 112. Second nitride semiconductor layer 103 functions as a guard ring.

Second nitride semiconductor layer 103 has a film thickness in a range of from 300 nm to 600 nm, for example. Second nitride semiconductor layer 103 is formed by forming the p-type GaN layer by MOCVD, and dry etching a part of the p-type GaN layer after resist patterning, for example. Here, the resist is tapered by, for example, annealing the resist with an electric griddle after the resist patterning at a temperature of 120 degrees Celsius for approximately five minutes. When dry etching is performed after the annealing, a taper corresponding to the shape of the resist is formed in recess 104 and mesa 105. An angle of the taper can be controlled by the annealing temperature and time. Since the taper allows more light to be diffused in the horizontal direction, on-resistance is reduced by the photoconductive effect at the portion irradiated with light. As described below, it is sufficient that at least a lateral surface of protrusion 112 is inclined with respect to an interface between first nitride semiconductor layer 102 and second nitride semiconductor layer 103.

Recess 104 and mesa 105 are formed to reach first nitride semiconductor layer 102. It is sufficient that second nitride semiconductor layer 103 is arranged in a ring shape in a plan view, and in the present embodiment, second nitride semiconductor layer 103 is approximately circular. The intended meaning of the word "approximately" is to include manufacturing errors, and in this case, the circle is not limited to a true circle.

With the above structure, when light is emitted due to recombination of electron-hole pairs at the pn junction region between first nitride semiconductor layer 102 and second nitride semiconductor layer 103, a greater amount of light is diffused into first nitride semiconductor layer 102 on an outer side of second nitride semiconductor layer 103 in a plan view. Therefore, the on-resistance of the entire device can be reduced by the photoconductive effect. With this, the forward current at a time of high voltage application increases and the peak forward surge current can be improved.

Injection separation portion 106 is formed to enclose second nitride semiconductor layer 103 in a plan view. Injection separation portion 106 is formed by, for example, implanting boron ions after the above-described resist patterning.

Insulating film 107 covers a part of mesa 105 and a part of second nitride semiconductor layer 103. Insulating film 107 is formed by, for example, plasma Chemical Vapor Deposition (CVD), and includes silicon dioxide ($SiO_2$), for example. After the resist patterning described above, a part of insulating film 107 is dry-etched to expose a part of recess 104 and a part of second nitride semiconductor layer 103. Insulating film 107 has a film thickness in a range of from 300 nm to 1000 nm, for example.

First anode electrode 108 is disposed above first nitride semiconductor layer 102 and second nitride semiconductor layer 103. First anode electrode 108 is in Schottky contact with first nitride semiconductor layer 102 in recess 104. First anode electrode 108 is in ohmic contact with second nitride semiconductor layer 103. First anode electrode 108 includes palladium (Pd) and gold (Au) and is formed by an electron beam (EB) evaporation technique. First anode electrode 108 has a film thickness in a range of, for example, from 100 nm to 300 nm for Pd and in a range of from 100 nm to 500 nm for Au.

Cathode electrode 110 is disposed under a back surface (second major surface) of substrate 101. Cathode electrode 110 is, for example, a stacked body including titanium (Ti) disposed closer to substrate 101 and Au disposed on Ti. Ti has a film thickness in a range of from 50 nm to 100 nm, and Au has a film thickness in a range of from 100 nm to 300 nm. Cathode electrode 110 is formed by, for example, EB evaporation.

Figure 4A:
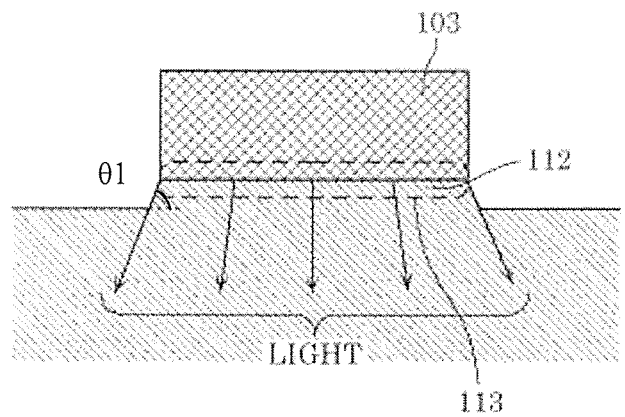
FIG. 4A is a cross-sectional view illustrating a variation of shapes of a protrusion of a first nitride semiconductor layer and a second nitride semiconductor layer.
Figure 4B:
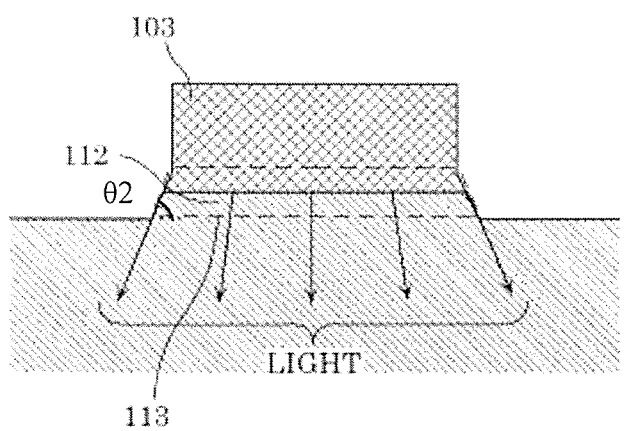
FIG. 4B is a cross-sectional view illustrating a variation of shapes of the protrusion of the first nitride semiconductor layer and the second nitride semiconductor layer.
Figure 4C:
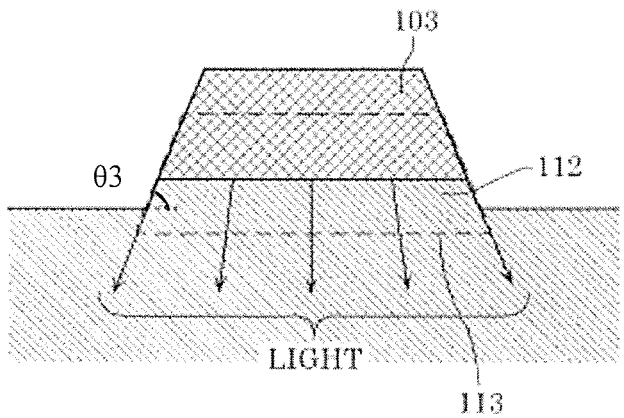
FIG. 4C is a cross-sectional view illustrating a variation of shapes of the protrusion of the first nitride semiconductor layer and the second nitride semiconductor layer.

FIG. 4A, FIG. 4B, and FIG. 4C are cross-sectional views illustrating variations in shapes of protrusion 112 of first nitride semiconductor layer 102 and second nitride semiconductor layer 103. Constituent elements such as electrodes and insulating films are omitted. Although the drawings include lateral surfaces drawn linearly for convenience, a case where the lateral surfaces are rounded due to manufacturing errors etc. is also included in the scope of the present disclosure.

In the structure illustrated in FIG. 4A, the lateral surface of protrusion 112 is inclined by an angle of θ1 with respect to the first major surface of substrate 101. With this structure, the light emitted from depletion layer 113 is likely to be diffused. Therefore, the on-resistance of the entire device can be reduced by the photoconductive effect. Note that θ1 may be in a range of from 30 degrees to 80 degrees.

In the structure illustrated in FIG. 4B, not only the lateral surface of protrusion 112 but also at least part of a lateral surface of second nitride semiconductor layer 103 is inclined by the angle of θ2 with respect to the first major surface of substrate 101. The part of the lateral surface may be a lateral surface of a lower portion of second nitride semiconductor layer 103 and intersect with an interface between first nitride semiconductor layer 102 and second nitride semiconductor layer 103. Note that θ2 may be in a range of from 30 degrees to 80 degrees.

With this structure, the light emitted at depletion layer 113, especially at a side closer to second nitride semiconductor layer 103, is more likely to be diffused as compared with the structure illustrated in FIG. 4A. Therefore, the on-resistance of the entire device can be further reduced by the photoconductive effect.

In the structure illustrated in FIG. 4C, an entirety of the lateral surface of second nitride semiconductor layer 103 is inclined by the angle of θ3 with respect to the first major surface of substrate 101. Note that θ3 may be in a range of from 30 degrees to 80 degrees.

The structure illustrated in FIG. 4C is the same as the structure illustrated in FIG. 3. With this structure, even when depletion layer 113 expands to the vicinity of the top surface of second nitride semiconductor layer 103, the emitted light is more likely to be diffused as compared with the structure illustrated in FIG. 4B. Therefore, the on-resistance of the entire device can be further reduced by the photoconductive effect.

The above structure allows providing a nitride semiconductor device achieving a high reverse breakdown voltage, a low forward voltage, and a high peak forward surge current.

Variation 1 of Embodiment 1

Figure 5:
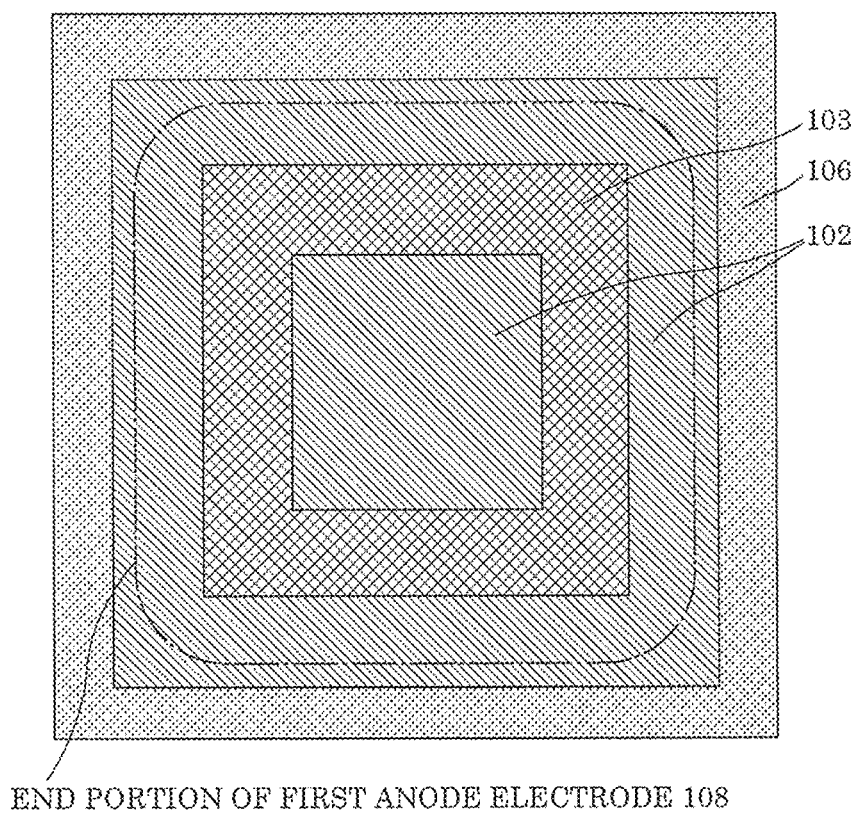
FIG. 5 is a plan view of a nitride semiconductor device according to Variation 1 of Embodiment 1.

FIG. 5 is a plan view of a nitride semiconductor device according to Variation 1 of Embodiment 1. In the present embodiment, first anode electrode 108 may have a substantially quadrangular shape in a plan view. Furthermore, second nitride semiconductor layer 103 may have, in a plan view, an inner periphery in one of a substantially quadrangular shape and a substantially circular shape. Furthermore, second nitride semiconductor layer 103 may have, in a plan view, an outer periphery in a substantially quadrangular shape. Here, the quadrangular shape includes a square, a rectangle, and a rhombus.

With this structure, in the case where plural diodes are formed on a single semiconductor layer, the diodes can be installed with an improved efficiency, which leads to cost reduction.

Here, it is possible to suppress the reduction in breakdown voltage due to the electric field strength at the corner of first anode electrode 108 by chamfering or filleting the corners of first anode electrode 108.

Variation 2 of Embodiment 1

Figure 6:
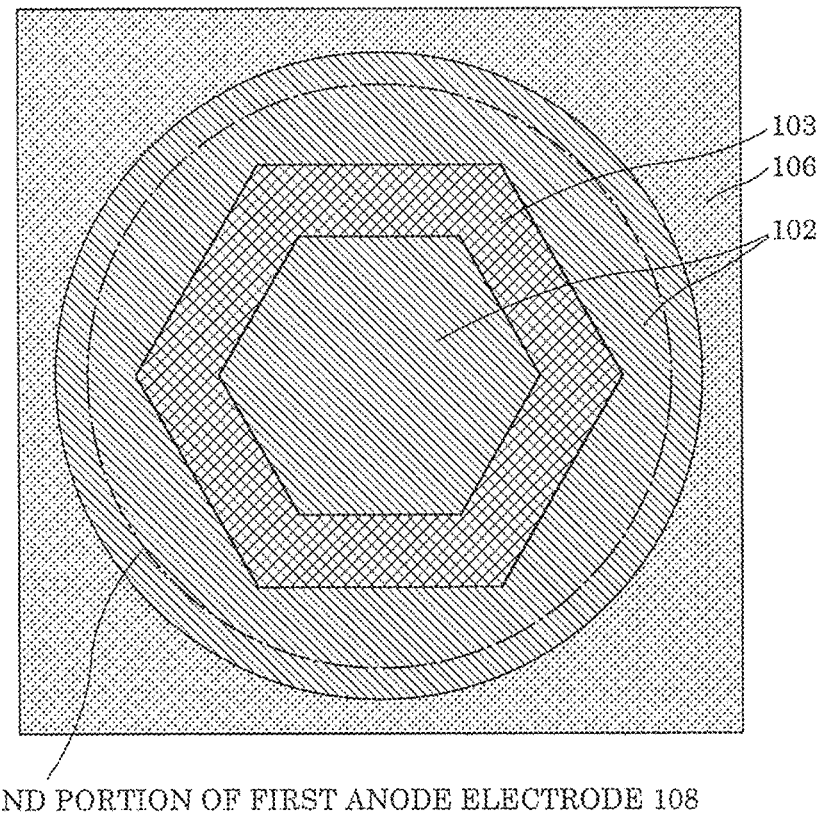
FIG. 6 is a plan view of a nitride semiconductor device according to Variation 2 of Embodiment 1.

FIG. 6 is a plan view of a nitride semiconductor device according to Variation 2 of Embodiment 1. In the present embodiment, first anode electrode 108 may have a substantially circular shape in a plan view. Furthermore, second nitride semiconductor layer 103 may have, in a plan view, an inner periphery in one of substantially hexagonal shape and a substantially circular shape. Furthermore, second nitride semiconductor layer 103 may have, in a plan view, an outer periphery in a substantially hexagonal shape.

With this structure, in the case where plural diodes are formed on a single semiconductor layer, it is possible to arrange the diodes like a honeycomb (wasps' nest). Thus, the diodes can be installed with an improved efficiency, which leads to cost reduction.

Embodiment 2

Figure 7:
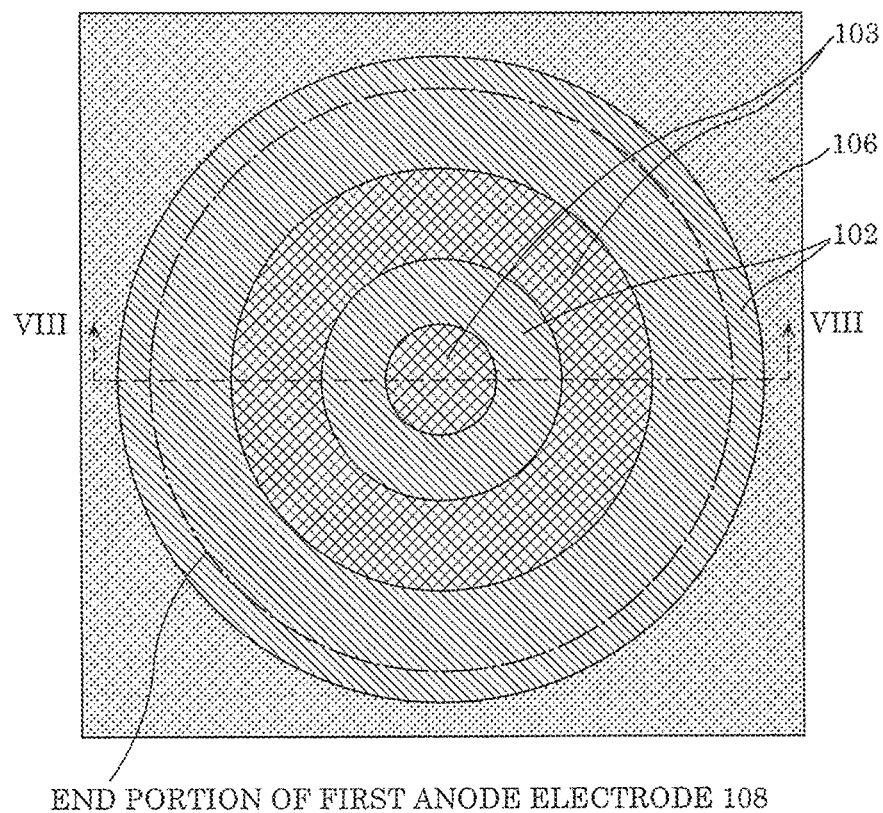
FIG. 7 is a plan view of a nitride semiconductor device according to Embodiment 2.
Figure 8:
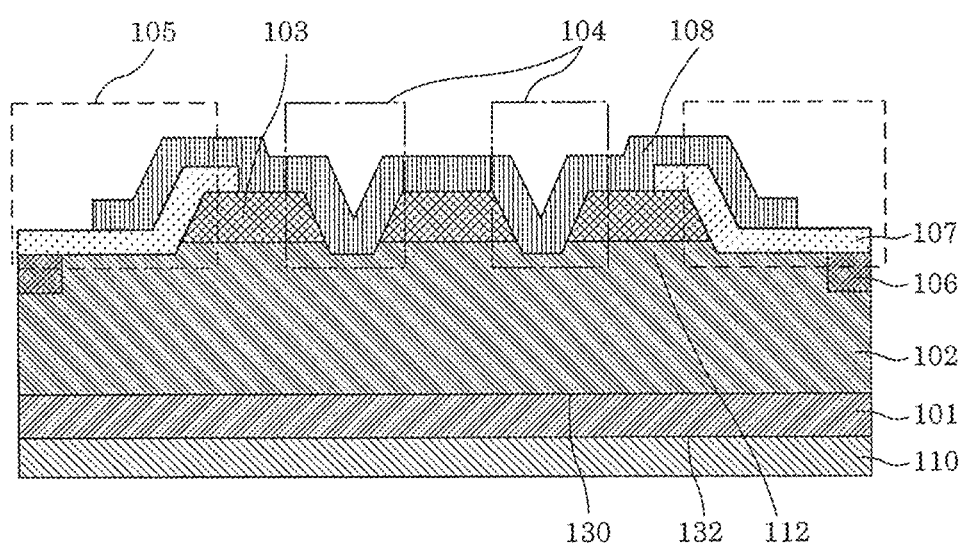
FIG. 8 is a cross-sectional view of the nitride semiconductor device according to Embodiment 2.

FIG. 7 is a plan view of a nitride semiconductor device according to Embodiment 2. FIG. 7 is a plan view excluding insulating film 107 and first anode electrode 108. FIG. 8 is a cross-sectional view of the nitride semiconductor device according to Embodiment 2. FIG. 8 is a cross-sectional view, at a VIII-VIII line, of the semiconductor device in FIG. 7. As illustrated in FIG. 8, the nitride semiconductor device according to Embodiment 2 includes substrate 101, first nitride semiconductor layer 102, second nitride semiconductor layer 103, recess 104, mesa 105, injection separation portion 106, insulating film 107, first anode electrode 108, and cathode electrode 110.

Hereinafter, description on Embodiment 2 will be provided focusing on differences from Embodiment 1.

In the plan view illustrated in FIG. 7, second nitride semiconductor layer 103 is arranged substantially concentrically, and in the cross-sectional view of FIG. 8, plural recesses 104 are formed. It is sufficient that the number of substantially concentric rings is at least two.

With this structure, the pn junction region is expanded as compared with that in Embodiment 1. Accordingly, the light is more likely to be diffused into the entire device. Thus, the on-resistance is reduced by the photoconductive effect.

Variations of Embodiment 2

FIG. 9 to FIG. 13 each illustrates a variation of the present embodiment in a plan view.

Figure 9:
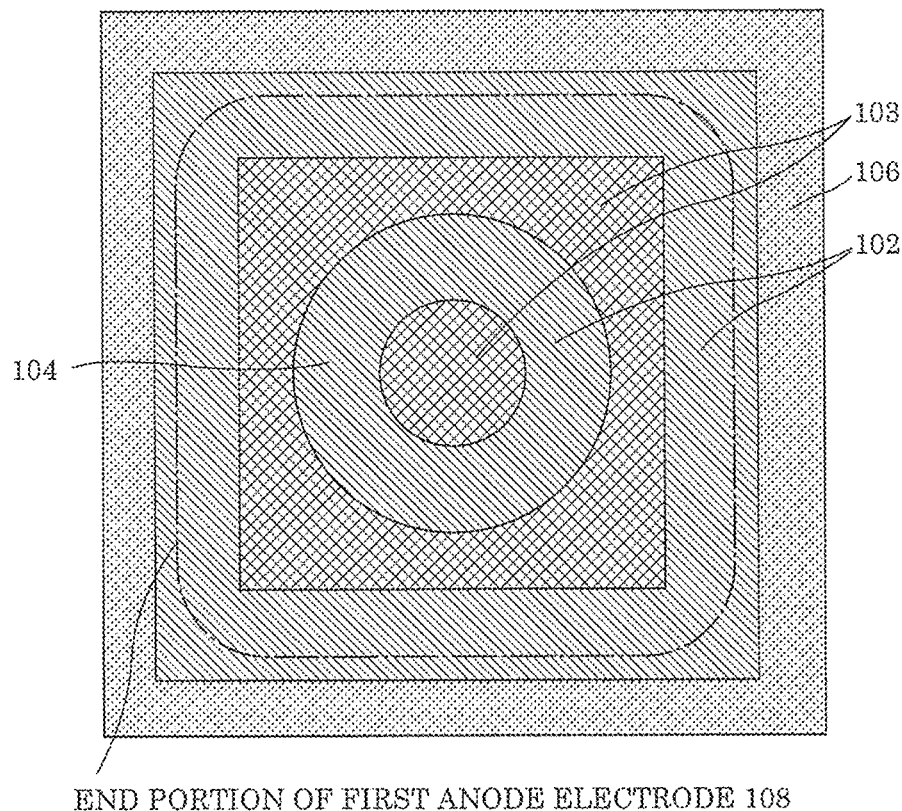
FIG. 9 is a plan view of a nitride semiconductor device according to Variation 1 of Embodiment 2.

FIG. 9 is a plan view of a nitride semiconductor device according to Variation 1 of Embodiment 2. In FIG. 9, second nitride semiconductor layer 103 is arranged substantially concentrically and has an outer periphery in a substantially quadrangular shape.

Figure 10:
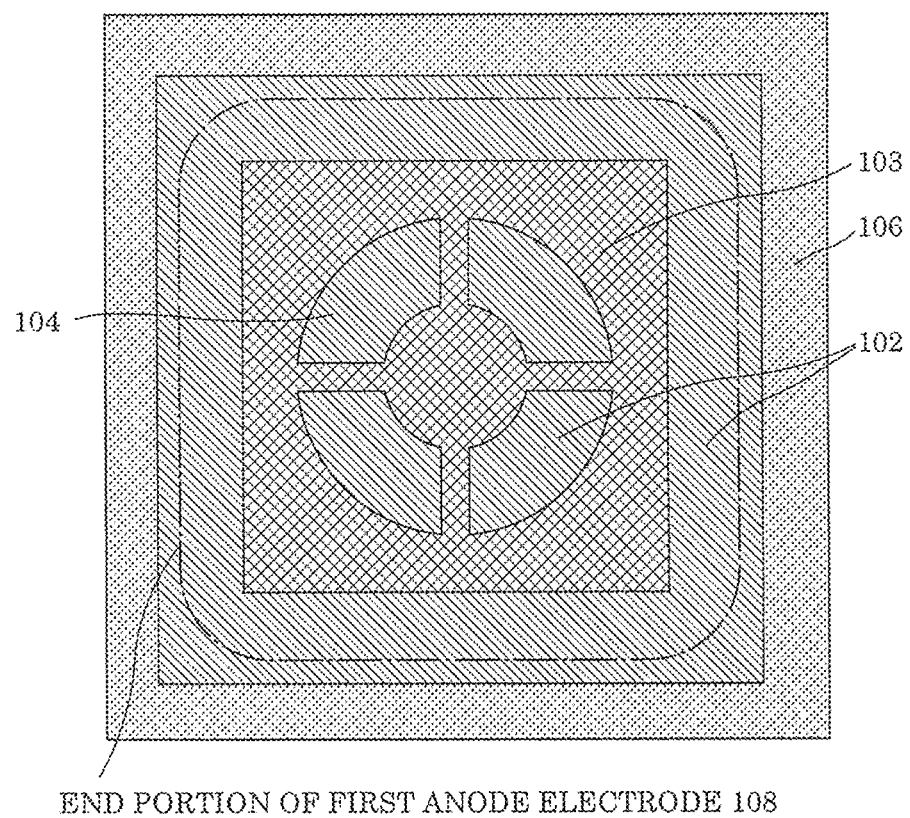
FIG. 10 is a plan view of a nitride semiconductor device according to Variation 2 of Embodiment 2.

FIG. 10 is a plan view of a nitride semiconductor device according to Variation 2 of Embodiment 2. In FIG. 10, second nitride semiconductor layer 103 is not divided into plural layers. In other words, second nitride semiconductor layer 103 has, in a plan view, plural substantially fan-shaped recesses 104 spaced apart from each other.

Figure 11:
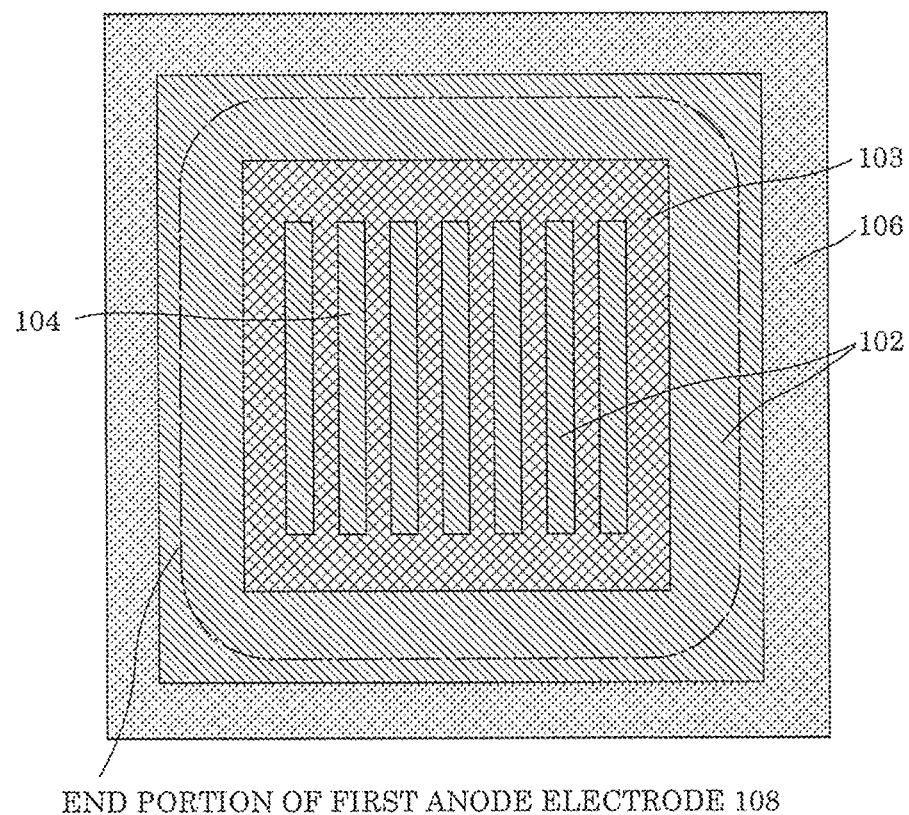
FIG. 11 is a plan view of a nitride semiconductor device according to Variation 3 of Embodiment 2.

FIG. 11 is a plan view of a nitride semiconductor device according to Variation 3 of Embodiment 2. In FIG. 11, second nitride semiconductor layer 103 has, in a plan view, plural slit-like recesses 104.

Figure 12:
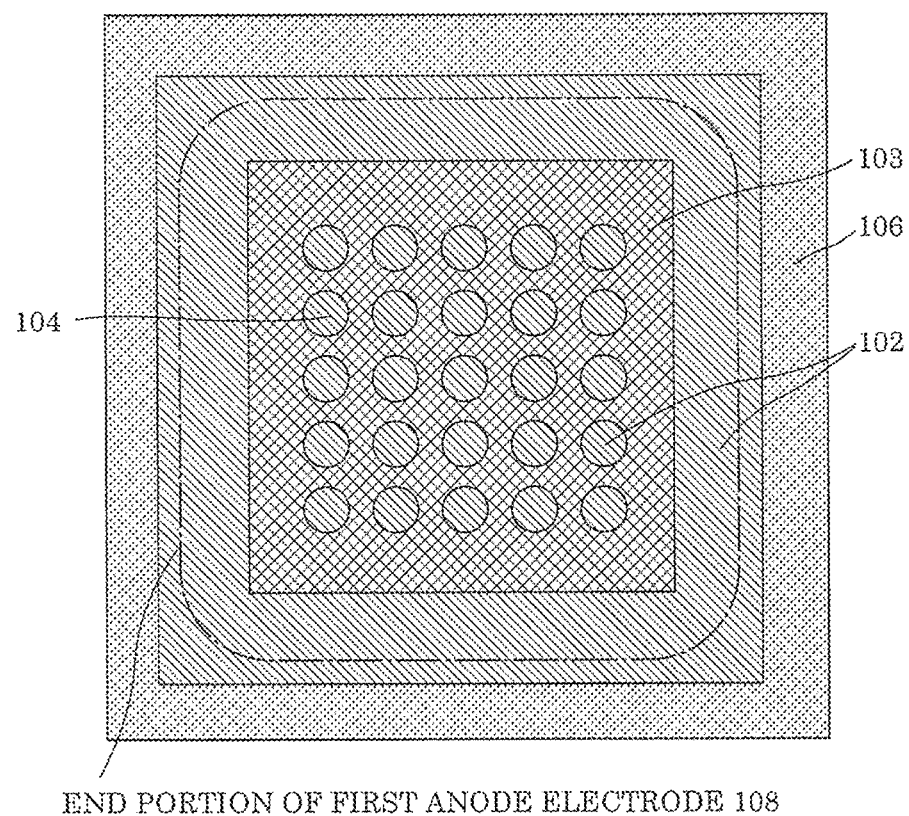
FIG. 12 is a plan view of a nitride semiconductor device according to Variation 4 of Embodiment 2.

FIG. 12 is a plan view of a nitride semiconductor device according to Variation 4 of Embodiment 2. In FIG. 12, in a plan view, plural recesses 104 are arranged in a matrix in second nitride semiconductor layer 103. Recess 104 may have, in a plan view, one of a substantially circular shape, a substantially quadrangular shape, and a substantially hexagonal shape, for example.

Figure 13:
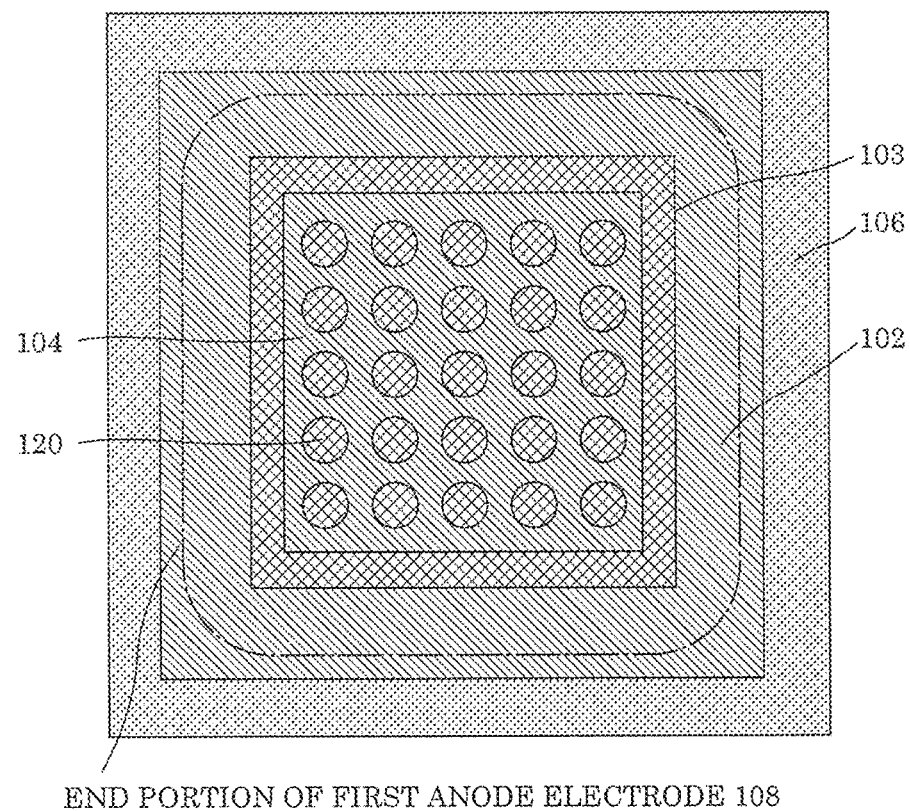
FIG. 13 is a plan view of a nitride semiconductor device according to Variation 5 of Embodiment 2.

FIG. 13 is a plan view of a nitride semiconductor device according to Variation 5 of Embodiment 2. In FIG. 13, in a plan view, second nitride semiconductor layer 103 includes plural island structures 120 and encloses plural island structures 120. Island structure 120 may have, in a plan view, one of a substantially circular shape, a substantially quadrangular shape, and a substantially hexagonal shape, for example.

Embodiment 3

Figure 14:
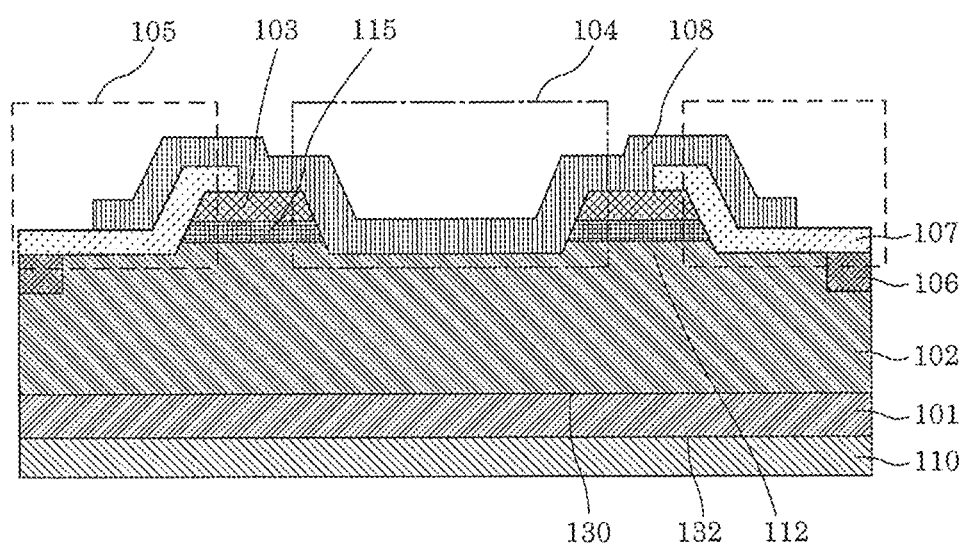
FIG. 14 is a cross-sectional view of a nitride semiconductor device according to Embodiment 3.

FIG. 14 is a cross-sectional view of a nitride semiconductor device according to Embodiment 3. As illustrated in FIG. 14, the nitride semiconductor device according to Embodiment 3 includes substrate 101, first nitride semiconductor layer 102, second nitride semiconductor layer 103, recess 104, mesa 105, injection separation portion 106, insulating film 107, first anode electrode 108, cathode electrode 110, and quantum well active layer 115. The nitride semiconductor device according to the present embodiment differs in structure from the nitride semiconductor device according to Embodiment 1 in that quantum well active layer 115 is provided between first nitride semiconductor layer 102 and second nitride semiconductor layer 103. Hereinafter, description on Embodiment 3 will be provided focusing on differences between Embodiment 1.

Quantum well active layer 115 includes, for example, $In_xAl_yGa_{(1-x-y)}N$ ($0 \leq x \leq 1$, $0 \leq y \leq 1$, $0 \leq x+y \leq 1$), and has a quantum level greater than or equal to a band gap of first nitride semiconductor layer 102. Quantum well active layer 115 may have a low impurity concentration, and have a magnesium (Mg) concentration and silicon (Si) concentration equal to or less than $1 \times 10^{18}$ cm$^{-3}$. Quantum well active layer 115 may be undoped, that is, may not be intentionally introduced with impurities. In this case, quantum well active layer 115 is substantially depleted, which improves the reverse breakdown voltage further.

It is sufficient that recess 104 reaches first nitride semiconductor layer 102. Lateral surfaces of quantum well active layer 115 may be inclined with respect to first major surface 130 by a same angle as the angle of the lateral surface of protrusion 112.

Quantum well active layer 115 may have a film thickness in a range of from 1 nm to 10 nm. Second nitride semiconductor layer 113 may have a film thickness in a range of from 300 nm to 600 nm, for example.

With this structure, electrons are likely to be confined in quantum well active layer 115, which increases the probability of recombination and the amount of light emission. As a result, the on-resistance is further reduced by the photoconductive effect.

Embodiment 4

Figure 15:
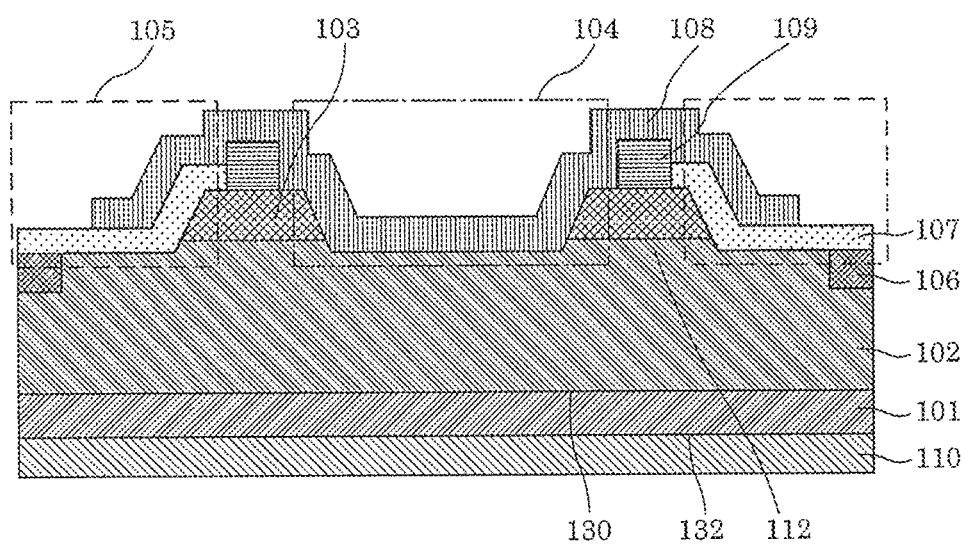
FIG. 15 is a cross-sectional view of a nitride semiconductor device according to Embodiment 4.

FIG. 15 is a cross-sectional view of a nitride semiconductor device according to Embodiment 4. As illustrated in FIG. 15, the nitride semiconductor device according to Embodiment 4 includes substrate 101, first nitride semiconductor layer 102, second nitride semiconductor layer 103, recess 104, mesa 105, injection separation portion 106, insulating film 107, first anode electrode 108, second anode electrode 109, and cathode electrode 110. The nitride semiconductor device according to the present embodiment differs in structure from the nitride semiconductor device according to Embodiment 1 in that second anode electrode 109 is provided on second nitride semiconductor layer 103. Hereinafter, description on Embodiment 4 will be provided focusing on differences between Embodiment 1.

First anode electrode 108 is in Schottky contact with first nitride semiconductor layer 102, and second anode electrode 109 is in ohmic contact with second nitride semiconductor layer 103.

When lowering a forward voltage Vf, it is required to lower Schottky barrier height. In order to lower Schottky barrier height, it is required to make work-function of metal smaller. However, with metal having a small work-function, it is difficult to form an excellent ohmic contact with the p-type semiconductor layer. In the case where metal having a large work-function is used to ensure ohmic contact with the p-type semiconductor layer, Vf increases which increases the loss.

In contrast, with the structure according to the present embodiment, it becomes possible to select an optimal material for the anode electrode, which achieves a low Vf and high forward surge current. The optimal material for the anode electrode shows an excellent Schottky contact with low Vf for first nitride semiconductor layer 102 and shows a low contact resistance for second nitride semiconductor layer 103 which is the p-type semiconductor layer.

Second anode electrode 109 includes material which is in ohmic contact with second nitride semiconductor layer 103, for example at least one of nickel (Ni), platinum (Pt), and Au, and is formed by EB evaporation, for example. Second anode electrode 109 has a film thickness in a range of from 100 nm to 300 nm for Ni, 100 nm to 300 nm for Pt, and 100 nm to 500 nm for Au, for example.

Other Embodiments

Note that the nitride semiconductor device according to the present disclosure is not defined by those described in Embodiments 1 to 4 and their Variations. Other embodiments achieved by combining arbitrary constituent elements in the above embodiments and variations, modifications obtained by applying various modifications conceived by those skilled in the art to the above embodiments and variations as long as they do not depart from the essence of the present disclosure, and various devices including the nitride semiconductor device according to the embodiments and variations are also included in the present disclosure.

INDUSTRIAL APPLICABILITY

The nitride semiconductor device according to the present disclosure is useful as power devices for automobile, industrial, and consumer use, for example.

What is claimed is:

1. A nitride semiconductor device, comprising:
a substrate having a first major surface and a second major surface;
a first nitride semiconductor layer of a first conductivity type which is disposed on the first major surface and has a protrusion;
a second nitride semiconductor layer of a second conductivity type disposed on the protrusion;
a first anode electrode disposed above the first nitride semiconductor layer and the second nitride semiconductor layer; and
a cathode electrode including titanium and disposed under the second major surface, wherein:
a lateral surface of the protrusion is inclined by a first angle with respect to the first major surface,
the second nitride semiconductor layer has a plurality of recesses, and
the plurality of recesses are arranged in a matrix in a plan view of the substrate.

2. The nitride semiconductor device according to claim 1, wherein each of the plurality of recesses reaches the first nitride semiconductor layer.

3. The nitride semiconductor device according to claim 1, further comprising:
a second anode electrode which is in ohmic contact with the second nitride semiconductor layer,
wherein the second anode electrode is electrically connected with the first anode electrode.

4. The nitride semiconductor device according to claim 1, wherein the first angle is in a range of from 30 degrees to 80 degrees.

5. The nitride semiconductor device according to claim 1, wherein at least a part of a lateral surface of the second nitride semiconductor layer is inclined by a second angle with respect to the first major surface.

6. The nitride semiconductor device according to claim 5, wherein the second angle is in a range of from 30 degrees to 80 degrees.

7. The nitride semiconductor device according to claim 1, wherein an entirety of the lateral surface of the second nitride semiconductor layer is inclined by a third angle with respect to the first major surface.

8. The nitride semiconductor device according to claim 7, wherein the third angle is in a range of from 30 degrees to 80 degrees.

9. A nitride semiconductor device, comprising:
a substrate having a first major surface and a second major surface;
a first nitride semiconductor layer of a first conductivity type which is disposed on the first major surface and has a protrusion;
a second nitride semiconductor layer of a second conductivity type disposed on the protrusion;
a first anode electrode disposed above the first nitride semiconductor layer and the second nitride semiconductor layer; and
a cathode electrode including titanium and disposed under the second major surface, wherein:
a lateral surface of the protrusion is inclined by a first angle with respect to the first major surface, and
the second nitride semiconductor layer includes a plurality of island structures and encloses the plurality of island structures in a plan view of the substrate.

10. A nitride semiconductor device, comprising:
a substrate having a first major surface and a second major surface;
a first nitride semiconductor layer of a first conductivity type which is disposed on the first major surface and has a protrusion;
a second nitride semiconductor layer of a second conductivity type disposed on the protrusion;
a first anode electrode disposed above the first nitride semiconductor layer and the second nitride semiconductor layer;
a cathode electrode including titanium and disposed under the second major surface; and
a quantum well active layer which is disposed between the first nitride semiconductor layer and the second nitride semiconductor layer and has a quantum level greater than a band gap of the first nitride semiconductor layer,
wherein a lateral surface of the protrusion is inclined by a first angle with respect to the first major surface.

11. The nitride semiconductor device according to claim 10,
wherein a lateral surface of the quantum well active layer is inclined by the first angle with respect to the first major surface.

* * * * *